United States Patent
Mann et al.

(10) Patent No.: US 10,212,797 B2
(45) Date of Patent: Feb. 19, 2019

(54) METHOD OF MAINTAINING A SUPPLY OF POWER TO A LOAD

(71) Applicant: TRUMPF Huettinger GmbH + Co. KG, Freiburg (DE)

(72) Inventors: Ekkehard Mann, Gundelfingen (DE); Markus Winterhalter, Bad Krozingen (DE); Florian Zehetner, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 15/386,763

(22) Filed: Dec. 21, 2016

(65) Prior Publication Data
US 2017/0105274 A1    Apr. 13, 2017

Related U.S. Application Data

(63) Continuation of application No. PCT/EP2015/064437, filed on Jun. 25, 2015.

(30) Foreign Application Priority Data

Jun. 27, 2014   (DE) .................. 10 2014 212 439

(51) Int. Cl.
*H05H 1/24* (2006.01)
*H01J 37/32* (2006.01)
(Continued)

(52) U.S. Cl.
CPC ......... *H05H 1/24* (2013.01); *H01J 37/32128* (2013.01); *H01J 37/32183* (2013.01);
(Continued)

(58) Field of Classification Search
CPC .. H05H 1/24; H05H 1/54; H05H 1/00; H05H 1/46; H01J 37/32926; H01J 37/32908;
(Continued)

(56) References Cited

U.S. PATENT DOCUMENTS

| 5,923,099 | A | 7/1999 | Bilir |
| 7,049,751 | B2 * | 5/2006 | Blackburn ........ H01J 37/32082 |
| | | | 204/298.08 |

(Continued)

FOREIGN PATENT DOCUMENTS

| DE | 19643709 A1 | 5/1997 |
| DE | 29919711 U1 | 10/2000 |

(Continued)

OTHER PUBLICATIONS

International Search Report from corresponding PCT Application No. PCT/EP2015/064437, dated Oct. 13, 2015, 6 pages.

*Primary Examiner* — Vibol Tan
(74) *Attorney, Agent, or Firm* — Fish & Richardson P.C.

(57) ABSTRACT

A method of maintaining a supply of power to a load comprising operating a power generator connected to a mains voltage in a rated operating mode, generating a power signal by the power generator, feeding the power signal to the load, monitoring the mains voltage or a variable derived therefrom for an occurrence of a first specified event, and operating the power generator in a first predefined operating mode based on the occurrence of the first specified event, wherein the first predefined operating mode differs from the rated operating mode.

19 Claims, 3 Drawing Sheets

(51) Int. Cl.
*H05H 1/54* (2006.01)
*H05H 1/46* (2006.01)
*H02J 9/06* (2006.01)

(52) U.S. Cl.
CPC .. *H01J 37/32908* (2013.01); *H01J 37/32926* (2013.01); *H01J 37/32944* (2013.01); *H02J 9/06* (2013.01); *H05H 1/46* (2013.01); *H05H 1/54* (2013.01)

(58) Field of Classification Search
CPC ........... H01J 37/32935; H01J 37/32183; H01J 37/3299; H01J 37/32082; H01J 37/32091; H01J 37/32174; H01J 37/32422; H01J 37/32256; H02J 9/06
See application file for complete search history.

(56) References Cited

U.S. PATENT DOCUMENTS

| | | | | |
|---|---|---|---|---|
| 7,795,817 | B2* | 9/2010 | Nitschke | H01J 37/32935 315/111.21 |
| 8,704,607 | B2* | 4/2014 | Yuzurihara | H01J 37/32082 156/345.28 |
| 9,170,295 | B2* | 10/2015 | Choi | G01R 19/0061 |
| 9,316,675 | B2* | 4/2016 | Klein | H01J 37/32 |
| 9,578,731 | B2* | 2/2017 | Van Zyl | H05H 1/46 |
| 9,854,659 | B2* | 12/2017 | Van Zyl | H05H 1/46 |
| 2004/0124821 | A1 | 7/2004 | Elkin et al. | |
| 2013/0221847 | A1* | 8/2013 | Choi | G01R 19/0061 315/111.41 |
| 2016/0111259 | A1* | 4/2016 | Van Zyl | H05H 1/46 315/111.21 |

FOREIGN PATENT DOCUMENTS

| | | |
|---|---|---|
| DE | 69717243 | 5/2003 |
| DE | 69717246 T2 | 5/2003 |
| DE | 102006043898 A1 | 4/2008 |
| DE | 202010012884 U1 | 3/2011 |
| DE | 102012223662 A1 | 6/2014 |
| EP | 1783904 A1 | 5/2007 |
| EP | 1786075 A1 | 5/2007 |
| WO | WO2005104329 A1 | 11/2005 |
| WO | WO2013003205 A1 | 1/2013 |

* cited by examiner

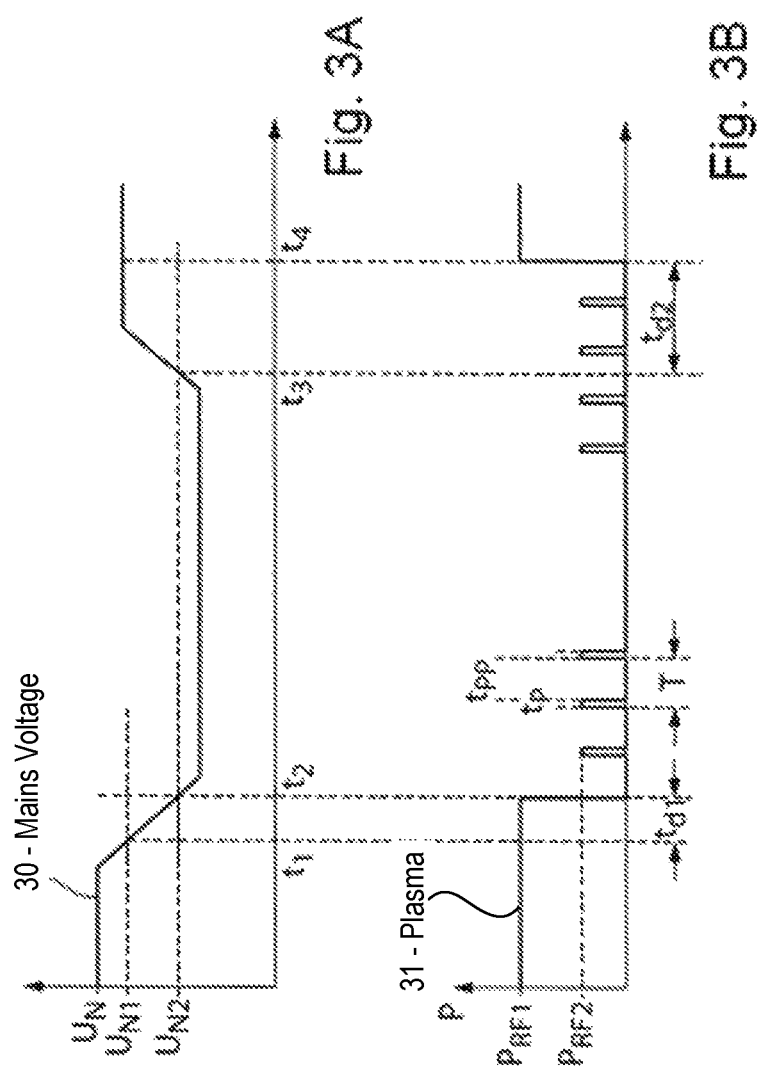

METHOD OF MAINTAINING A SUPPLY OF POWER TO A LOAD

CROSS-REFERENCE TO RELATED APPLICATIONS

This application is a continuation of and claims priority under 35 U.S.C. § 120 to PCT Application No. PCT/EP2015/064437 filed on Jun. 25, 2015, which claims priority to German Application No. 10 2014 212 439.5, filed on Jun. 27, 2014. The entire contents of these priority applications are incorporated herein by reference.

TECHNICAL FIELD

The invention relates to a power generator and a method in which a power generator connected to a mains voltage that supplies power to a load.

BACKGROUND

Power generators, in particular high-frequency generators, are usually supplied with power from a three-phase network which delivers 3×400 V at 50 Hz, for example. Due to weather influences, fluctuations on the load side, and other influences on the mains supply side, the mains voltage delivered by the three-phase network may have partial or total dips for varying time periods. This is particularly problematic if a plasma is used as the load that is supplied by the power generator. A plasma is dependent on the impedance of the power delivered by the power generator. If the power fails for some time, processes are carried out that cannot be directly reversed. For example, the plasma may go out, necessitating renewed ignition. If layers are produced using the plasma, the properties of the layer surfaces may be changed in an undesirable manner.

SUMMARY

One aspect of the inventive features includes a method in which a power generator connected to a mains voltage is operated in a rated operating mode, the mains voltage or a variable derived therefrom is monitored with regard to the occurrence of at least one specified event and a predefined operating mode of the power generator is triggered when the at least one specified event occurs, the predefined operating mode differing from the rated operating mode. This method can make it possible to bridge a mains voltage interruption so that the power generator withstands longer mains voltage interruptions and is quickly operational again.

In the rated operating mode, a power signal may be generated and fed to a load in order for a load to be operated as intended.

The method according to the invention may thus be used for supplying a load, in particular a plasma load, with power, a power signal to be fed to the load being generated in a rated operating mode by means of a power generator connected to a mains voltage, the mains voltage or a variable derived therefrom regarding the occurrence of at least one specified event being monitored and a predefined operating mode of the power generator being triggered when the at least one specified event occurs, which predefined operating mode differs from the rated operating mode. This method is particularly advantageous if the generator is a high-frequency power generator that generates a high-frequency power signal and supplies a plasma load with this generated high-frequency power signal. The predefined operating modes can for example be designed such that the supply of power to the load, in particular a plasma load, is maintained and the load is operated in a defined state.

Alternatively or in addition, a predefined operating mode can maintain the state of aggregation in the load, for example a plasma state.

Alternatively or in addition, it can be provided for a predefined operating mode to prevent a plasma from going out, if the load is a plasma load.

Alternatively or in addition, a predefined operating mode can be provided that keeps a specified number of charge carriers in the load, in particular in a plasma, moving.

Alternatively or in addition, it can be provided for the predefined operating mode to be one that reduces the output power of the power generator. In extreme cases, the output power of the power generator can be reduced to an output power of zero watts.

The disadvantages mentioned at the outset can be prevented by the method according to the invention. In particular, non-reversible processes in the load can be prevented. At the same time, a longer period of reduced mains voltage can be bridged without the power generator completely shutting down, i.e. without the control function thereof also shutting down.

In order to determine the occurrence of a first event, the mains voltage or the variable derived therefrom can be monitored with regard to a first reference value being overcome, in particular not being reached. For example, it is possible to monitor whether the mains voltage dips and falls below a specified reference value. In this case, a predefined operating mode can be triggered.

Alternatively or in addition, in order to determine the occurrence of a first event, the mains voltage or the variable derived therefrom can be monitored with regard to the duration for which the first reference value is overcome, in particular not reached. In particular, it can be provided for a predefined operating mode to be triggered if the mains voltage or the variable derived therefrom overcomes, in particular falls below, the first reference value for a specified first time period. It is thus possible to prevent a predefined operating mode from being triggered prematurely.

The specified first time period can be precisely specified, for example. Alternatively or in addition, the specified first time period can be set by the user, manually or via a data interface. Alternatively or in addition, the specified first time period can be variable depending on the speed of the change in the mains voltage or a variable derived therefrom. Alternatively or in addition, the specified first time period can be variable depending on the level of the power for supplying the load.

When the specified first event occurs, at least one of the following operating modes can be triggered:
a. reduction of the output power of the power generator,
b. switch to a mode of operation that has a lower current consumption compared with the present mode of operation.

In particular, it is possible to switch to pulsed-mode operation. This means that the power signal generated by the power generator is emitted in a pulsed manner. In particular, the power signal can be emitted at a duty factor (duty cycle) of <20%, in particular even of <10%, particularly preferably of <2%. This means that the energy stored in the power pack of the power generator can be maintained for a longer period of the plasma state of the load.

The output power of the power generator can be reduced to an output power of <20%, in particular even of <10%, particularly preferably of <2%.

The current consumption of the power generator can be reduced to a current consumption of <20%, in particular even of <10%, particularly preferably of <2%.

It is thus possible for the duration of a mains voltage reduction that can be bridged by the power generator to be increased by the factor of 50 and over. If a power generator in which the predefined operating mode is not triggered according to the invention can only withstand mains voltage reductions of from 1 ms to less than 10 ms before it turns off completely, a power generator in which the predefined operating mode is triggered according to the invention can thus withstand durations of greater than 10 ms to 1000 ms and over.

In order to determine the occurrence of a second event, the mains voltage or the variable derived therefrom can be monitored with regard to the first or a second reference value being overcome, in particular exceeded. If the occurrence of the second event is identified, a predefined operating mode can again be triggered. In this case, the mains voltage or the variable derived therefrom overcoming the first reference value in the opposite direction from that previously detected for the occurrence of the first event can be identified as the occurrence of the second event. However, a second reference value can also be used that does not correspond to the first reference value. The second reference value can be larger or smaller than the first reference value. The same variable as or a different variable from that used for determining the occurrence of the first event can be used to determine the occurrence of the second event.

In order to determine the occurrence of a second event, the mains voltage or the variable derived therefrom can be monitored with regard to the duration for which the first or a second reference value is overcome, in particular exceeded. In particular, it can be provided for a further predefined operating mode to be triggered if the mains voltage or the variable derived therefrom overcomes, in particular exceeds, the first or second reference value for a specified further time period. It is thus possible to prevent the predefined operating mode from being triggered prematurely. This is important for example in larger plants having a plurality of connected powerful current consumers having rated power drops of greater than 1 kW, in particular greater than 10 kW. Following a short reduction in mains voltage lasting from around a few microseconds to approximately 1000 ms, many current consumers switch off once their internal energy stores have been used up. However, even those current consumers that do not switch off after such a short time also use at least some of the energy stored in their energy stores. When the mains voltage increases again, most of the current consumers then simultaneously switch back to rated power consumption and have an additional power requirement in order to charge their internal energy stores. This additional power requirement can be disadvantageous if the mains power rating of the plant is not configured for a power supply of this kind. The overcurrent can thus very quickly lead to another mains voltage reduction. The mains voltage can also be completely lost due to overcurrent protectors being triggered.

The specified further time period can counteract this in that in particular the current consumers provided with large energy stores obtain their rated power from the supply mains again only after the specified further time period. Large energy stores can store in the range of from 1 J to a few 100 J electrical energy. The energy stores are often designed depending on the rated power of the current consumers, and are in the range of from 1 J/kW rated power to a few 10 J/kW rated power. During the specified further time period, the power generator itself, but also other consumers, can charge their energy stores without the mains supply needing to be overloaded.

Therefore, this method step is particularly important when the first or second reference value is exceeded following the first method step when the first reference value has not been reached because, in particular following a mains voltage dip, the risk of the supply mains being overloaded is particularly high since usually in this case a particularly large number of powerful current consumers simultaneously attempt to consume rated power and charge their energy stores.

The specified further time period can be precisely specified, for example. Alternatively or in addition, the specified further time period can be set by the user, manually or via a data interface. Alternatively or in addition, the specified further time period can be variable depending on the speed of the change in the mains voltage or a variable derived therefrom. Alternatively or in addition, the specified further time period can be variable depending on the level of the power for supplying the load. Alternatively or in addition, the specified further time period can be variable depending on the duration of the mains voltage reduction.

In all the method steps, the first or the second reference value can be overcome in a debounced manner. This means that a switch between falling below and exceeding the reference value within a specified interval is only recognised as such if the overcoming of the reference value that first occurred has been maintained following the specified interval. Debouncing of this kind can be achieved for example by using a Schmitt trigger, by introducing a hysteresis, or by checking several times during the interval that the reference value has been overcome.

When the specified second event occurs, at least one of the following operating modes can be triggered:
  a. increase in the output power of the power generator,
  b. switch to a mode of operation that has a higher current consumption compared with the present mode of operation.

In particular, the output power of the power generator can be increased to the original value, i.e. before a predefined operating mode has been triggered following the occurrence of the first specified event. It is thus possible to transition into the rated operating mode.

Alternatively or in addition, it is conceivable to return from a pulsed-mode operation having a low duty factor to the rated operating mode of the power supply, for example to the power signal being continuously supplied to the load, or being supplied in a pulsed-mode operation having a higher duty factor (duty cycle).

Alternatively or in addition, it is conceivable to switch to an operating mode in which a lower restart current is achieved when the mains voltage is recovered.

When the first event occurs, the setting of a matching circuit between the high-frequency power generator and the load can be fixed. In particular, capacitor positions of capacitors in the matching circuit can be maintained. It is thus easier to carry out impedance matching upon a return to the rated operating mode.

Alternatively to fixing the setting of a matching circuit when the first event occurs, the elements of the matching circuit can be set to predefined values. This is relevant, for example, in the case of mechanically variable or electronically switched matching circuits. If the frequency of the power generator is changed for the purpose of impedance matching, a specified frequency can also be set when the first event occurs.

The power generated while a predefined operating mode is carried out can be determined and the power can be generated in a following subsequent operating mode depending on the power determined in the predefined operating mode. It is in particular possible, in this manner, to switch from an operating mode that was set following the occurrence of the first event to the rated operating mode, a lower restart current being used in the intermediate subsequent operating mode. Alternatively, it is conceivable for the output power not delivered during the mains voltage dip to be determined and subsequently, when the mains voltage has returned, for the process to be extended or for the output power to be increased, depending on the output power that was not delivered during the interruption phase.

The invention also relates to a power generator comprising
- a measuring device for measuring a mains voltage or a variable derived therefrom,
- a monitoring device for monitoring the measured mains voltage or the variable derived therefrom, and
- an operating mode selection device.

The method according to the invention can be carried out using a power generator of this kind. The above-mentioned advantages result.

The operating mode selection device can be designed to set predefined operating modes.

The power generator can be used to supply loads in which the state of aggregation can change, such as in a plasma or evaporation processes.

A predefined operating mode can for example be designed such that the supply of power to the load, in particular a plasma load, is maintained and the load is operated in a defined state.

Alternatively or in addition, a predefined operating mode can maintain the state of aggregation in the load, for example a plasma state.

Alternatively or in addition, it can be provided for a predefined operating mode to prevent a plasma from going out, if the load is a plasma load.

Alternatively or in addition, a predefined operating mode can be provided that keeps a specified number of charge carriers in the load, in particular in a plasma, moving.

Alternatively or in addition, it can be provided for the predefined operating mode to be one that reduces the output power of the power generator, and in extreme cases reduces it to an output power of zero watts.

The power generator can comprise sufficient energy stores, in particular capacitive energy stores, to permit it to function for a specified time period in the predefined operating mode in which the measuring device, the monitoring device and the operating mode selection device are supplied with sufficient energy that the above-described method can be carried out. The capacitive energy stores can have capacitances of a few 100 µF. The capacitive energy stores are designed to be able to be charged to voltages of a few 100 V. Thus, several joules of energy can be stored.

Alternatively or in addition, the power generator can be used to supply loads in which the state of aggregation does not change, e.g. for inductive or dielectric heating. In the case of the last-mentioned loads, the output power can be reduced to zero when the first event occurs, e.g. by removing a 13.56 MHz increment of the power generator while the intermediate circuit(s) in the power generator remain(s) charged. As a result, a particularly low restart current can be achieved when the necessary mains voltage is recovered.

The power generator can comprise a measuring device for measuring the power generated.

Alternatively or in addition, an adjustment device can be provided for adjusting the power generated. The adjustment device can adjust the power generated when the power generator is operating in the first predefined operating mode based on the amount of power generated from the power signal as measured by the measuring device Further features and advantages of the invention will become apparent from the following description of an embodiment of the invention, by way of the drawings, which show details essential to the invention, and from the claims. The individual features may each be implemented in isolation or together in any desired combination in a variant of the invention.

Preferred embodiments of the invention are shown schematically in the drawings, and are described in further detail below with reference to the figures, in which:

DESCRIPTION OF DRAWINGS

FIG. 3A is a graph showing the temporal course of the mains voltage;

FIG. 3B is a graph showing the temporal course of the output power of a power generator;

DETAILED DESCRIPTION

Figure 1:
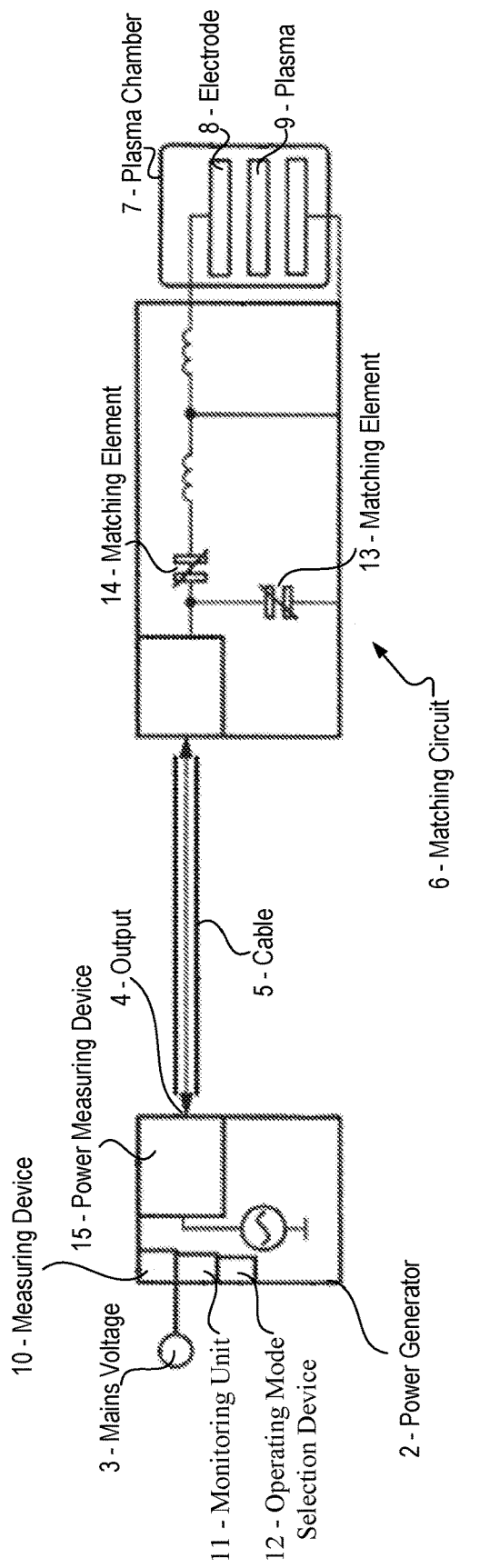
FIG. 1 is a schematic view of a plasma system.

FIG. 1 shows a plasma system 1 comprising a power generator 2 that is connected to a mains voltage 3. The mains voltage 3 will also be referred to in the following as the supply voltage. The power generator 2 generates a power signal that is emitted at the output 4. The power emitted at the output 4 can be provided to a plasma chamber 7, in particular an electrode 8 in the plasma chamber 7, via a cable 5 and an optional matching circuit 6. A plasma 9, for example, can be generated in the plasma chamber 7 using the power provided by the power generator 2. The mains voltage 3 provided, or a variable related thereto, can be detected by means of a measuring device 10. The detected variable can be fed to a monitoring unit 11 that monitors whether the measured mains voltage or the variable derived therefrom exceeds or falls below a specified reference value. If the monitoring device 11 determines that a specified event has occurred, an operating mode selection device 12 can trigger a predefined operating mode 2.

If the monitoring device 11 detects that a specified event has occurred, a signal can also be issued to the matching circuit 6 and matching elements 13, 14 can be set to a particular value or can be fixed at their existing value or in their present position. A predefined operating mode can make it possible, for example, for the plasma 9 in the plasma chamber 7 not to go out even though only a very low mains voltage 3 is available or said voltage has been completely lost.

The power at the output 4 can be measured by a power measuring device 15. This power can be a power that is generated in the power generator 2 and/or a power that is reflected by the load, e.g. by the plasma 9. The power generated in the power generator 2 can be controlled and/or the matching circuit 6 can be set depending on the measured power.

Figure 2:
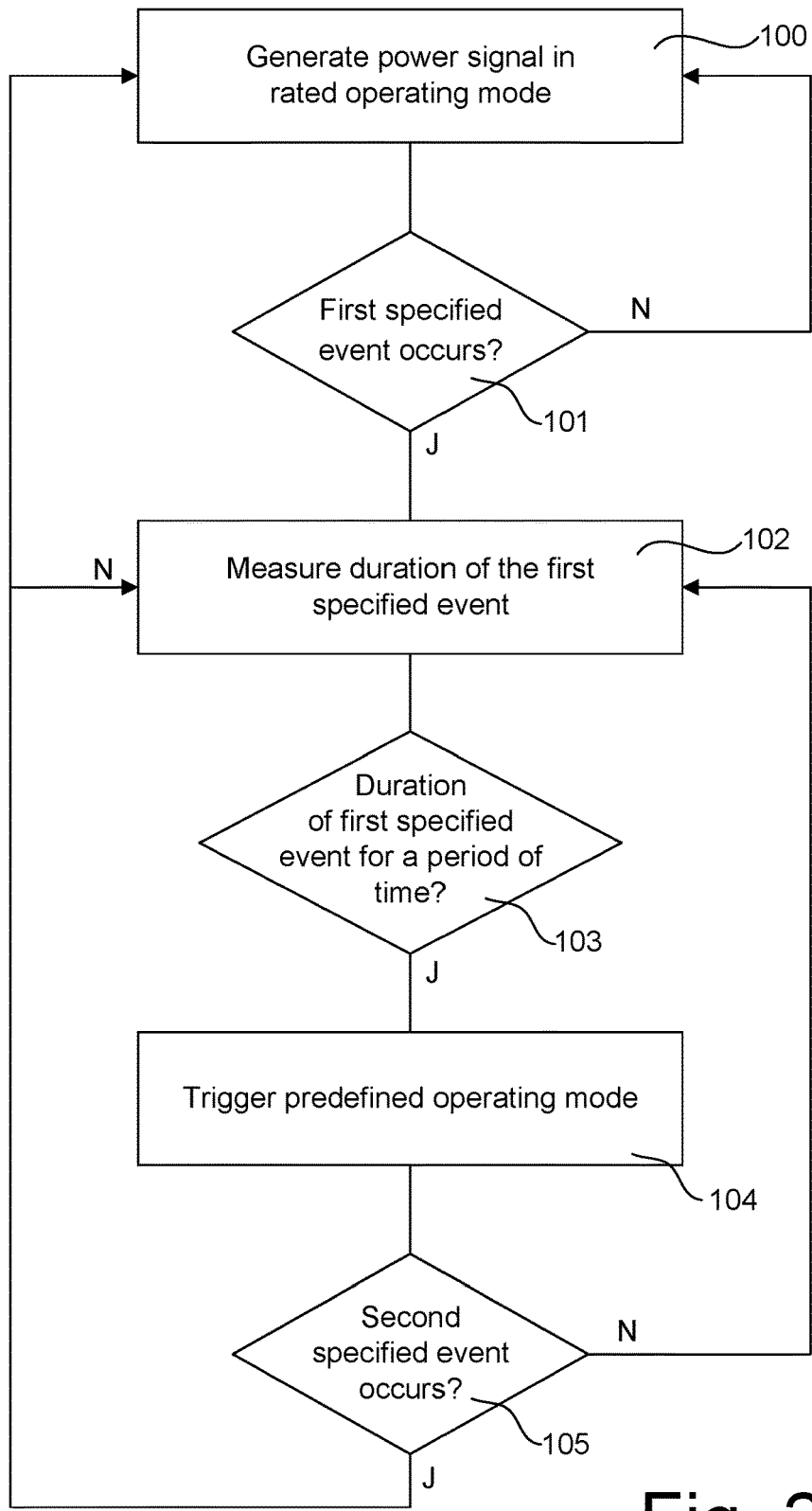
FIG. 2 is a flow diagram explaining the method according to the invention.

The method according to the invention is described in further detail in FIG. 2. In step 100, a power signal is generated by the power generator 2 in a rated operating mode, which signal is emitted at the output 4 and fed to a load, in particular to a plasma 9, in the plasma chamber 7. Step 101 monitors whether the measured mains voltage or the variable derived therefrom overcomes a specified first reference value. If this is not the case, step 100 recurs, i.e. the power is again generated in the rated operating mode in order to supply the load.

If, in contrast, it is detected that the first reference value has been overcome, there is a transition to step 102, in which, in order to determine the occurrence of a first event, the mains voltage or the variable derived therefrom is monitored with regard to the duration for which the first reference value is overcome, in particular stays below the first reference value.

Step 103 checks whether the mains voltage or the variable derived therefrom overcomes the first reference value for a specified first time period. If this is not the case, step 100 recurs, i.e. the power is again generated in the rated operating mode in order to supply the load.

If, in contrast, it is detected that the first reference value has been overcome for a specified first time period, there is a transition to step 104, in which a predefined operating mode of the power generator is triggered. For example, the power emitted by the power generator 2 can now be reduced.

Steps 102 and 103 can, however, also be omitted, i.e. it is also possible to go directly from step 101 to step 104, if the measured mains voltage or the variable derived therefrom overcomes a specified first reference value.

The optional step 105 monitors whether the mains voltage or a variable related thereto overcomes the first or a second reference value. If this is not the case, the predefined operating mode is maintained, i.e. there is a transition to step 102. If it is detected that the first or second reference value has been overcome, a further predefined operating mode is triggered. In the embodiment shown, this further predefined operating mode corresponds to the rated operating mode of step 100. However, it is also conceivable for another predefined operating mode to be implemented. Rather than directly triggering the further predefined operating mode, it can also be provided for the further predefined operating mode to be triggered if the mains voltage or the variable derived therefrom overcomes, in particular exceeds, the first or second reference value for a specified further time period.

FIG. 3A is a graph on which the mains voltage is plotted against time. The course of the mains voltage is denoted by reference sign 30. Initially, the entire mains voltage is available. At time point t1, however, the mains voltage 30 falls below a first reference value UN1. At time point t2, the mains voltage 30 was below the reference value UN1 for a first time period td1. This corresponds to the occurrence of a first specified event. Because the occurrence of the first specified event has been detected, a predefined operating mode is triggered which means, in the present case, that the power 31 (see FIG. 3B) emitted at the output 4 of the power generator 2 is reduced and in particular emitted in a pulsed manner.

The power 31 emitted at the output 4 of the power generator 2 is equal to the rated power PRF1 until time point t2. From time point t2 to time point t4, the emitted power 31 is pulsed at a power amplitude PRF2 that is reduced compared with the rated power PRF1. The period of the pulsed output power is denoted by T. It can be seen that the duration of the pulse tp is significantly shorter than the duration tpp of the pulse pause. This means that the duty factor is significantly <20%, in particular <10%. At time point t3 it is detected that the mains voltage 30 has exceeded a second reference value UN2. However, the operating mode is not yet changed. The occurrence of a second specified event is detected and the original output power is restored at time point t4 only when, at time point t4 once the further time period td2 has elapsed, the mains voltage 30 is still below the second reference value UN2.

The further time period td2 can be specified so as to be longer than the first time period td1. Said further time period can in particular be specified so as to be longer than the first time period td1 by a factor of 10. The first time period td1 can be specified so as to have a duration of from one microsecond to a few 1000 microseconds. The further time period td2 can be specified so as to have a duration of from one millisecond to a few 1000 milliseconds.

Referring here to FIG. 1, the power generator 2 can be accommodated in a housing, in particular in a metal housing, and can have electrical power supply terminals. One or more modules can be arranged in both devices. Modules can be mounted on metal main bodies and/or on printed circuit boards. Furthermore, ventilation terminals can be provided for air circulation and cooling. Furthermore, the power generator 2 can comprise various terminals such as coolant terminals or terminals for electrical connection to external components. All the terminals can be provided with electronic filters in order to increase the resistance of the power generator to interference and to limit the interference radiation of the power generator.

The measuring device 10, the monitoring device 11 and the operating mode selection device 12 can in each case form part of a control unit, either individually or in any desired combination. The control unit can be designed as an analogue or in particular as a digital control unit. For this purpose, the measurement signals are filtered, sampled and digitalized. A digital control unit can be implemented in a microprocessor, e.g. in a digital signal processor (DSP) or in a programmable logic device (PLD), in particular in a FPGA. The control unit can thus operate particularly quickly.

A number of embodiments of the invention have been described. Nevertheless, it will be understood that various modifications may be made without departing from the spirit and scope of the invention. Accordingly, other embodiments are within the scope of the following claims.

What is claimed is:

1. A method of maintaining a supply of power to a load comprising:
   operating a power generator connected to a mains voltage in a rated operating mode;
   generating a power signal by the power generator;
   feeding the power signal to the load;
   monitoring the mains voltage or a variable derived therefrom for an occurrence of a first specified event; and
   operating the power generator in a first predefined operating mode based on the occurrence of the first specified event, wherein the first predefined operating mode differs from the rated operating mode, and wherein the first specified event is a first reference value not being reached.

2. The method of claim 1, wherein the first specified event is the first reference value not being reached for a determined first duration of time.

3. The method of claim 1, wherein operating the power generator in the first predefined operating mode maintains the operation of the load in a defined state.

4. The method of claim 1, wherein the power generator is a high-frequency power generator and the power signal is a high-frequency power signal.

5. The method of claim 1, wherein operating the power generator in the first predefined operating mode maintains a state of aggregation in the load.

6. The method of claim 5, wherein the state of aggregation in the load is a plasma state.

7. The method of claim 1,
wherein the load is a plasma load, and
wherein operating the power generator in the first predefined operating mode prevents a plasma from going out of the plasma load.

8. The method of claim 1, wherein operating the power generator in the first predefined operating mode reduces an output power of the power signal generated by the power generator.

9. The method of claim 1, wherein operating the power generator in the first predefined operating mode reduces a current consumption of the power generator.

10. The method of claim 1 further comprising:
monitoring the mains voltage or a variable derived therefrom for an occurrence of a second specified event,
wherein the second specified event is a third reference value or a second reference value being exceeded.

11. The method of claim 10 further comprising:
operating the power generator in a second predefined operating mode based on the occurrence of the second specified event,
wherein the second predefined operating mode differs from the first predefined operating mode, and
wherein the second predefined operating mode increases an output power of the power signal generated by the power generator or increases a current consumption of the power generator.

12. The method of claim 1 further comprising:
monitoring the mains voltage or a variable derived therefrom for an occurrence of a second specified event,
wherein the second specified event is a third reference value or a second reference value being exceeded for a determined second duration of time.

13. The method of claim 1 further comprising:
fixing a setting of a matching circuit between the power generator and the load when the first specified event occurs.

14. The method of claim 1 further comprising:
determining a first amount of power generated while operating the power generator in the first predefined operating mode; and
operating the power generator in a second predefined operating mode, wherein a second amount of power generated while operating the power generator in the second predefined operating mode is dependent on the first amount of power.

15. A power generator comprising:
a measuring device coupled to a mains voltage and configured to measure the mains voltage or a variable derived therefrom;
a monitoring device configured to monitor the measured mains voltage or the variable derived therefrom for an occurrence of a specified event; and
an operating mode selection device,
wherein the power generator is configured to:
generate a power signal; and
feed the power signal to a load, and
wherein the operating mode selection device is configured to:
operate the power generator in a rated operating mode; and
operate the power generator in a first predefined operating mode based on the occurrence of the specified event, wherein the first predefined operating mode differs from the rated operating mode.

16. The power generator of claim 15, wherein the measuring device the measuring device is further configured to measure an amount of power generated from the power signal.

17. The power generator of claim 16 further comprising:
an adjustment device configured to adjust a strength of the generated power signal.

18. The power generator of claim 17, wherein the adjustment device adjusts the strength of the generated power signal when the power generator is operating the first predefined operating mode based on the amount of power generated from the power signal as measured by the measuring device.

19. The power generator of claim 15, wherein the specified event is a reference value not being reached for a determined duration of time.

* * * * *